United States Patent [19]

Vescovi et al.

[11] 4,451,812
[45] May 29, 1984

[54] ELECTROSTATIC SHIELD

[75] Inventors: Valentino F. Vescovi, Macleod; Arthur W. Richards, Plenty, both of Australia

[73] Assignee: Sphere Investments Limited, Nassau, The Bahamas

[21] Appl. No.: 372,371

[22] Filed: Apr. 27, 1982

Related U.S. Application Data

[63] Continuation of Ser. No. 154,295, May 29, 1980, abandoned.

[30] Foreign Application Priority Data

Jun. 19, 1979 [ZA] South Africa ............... 79/3030

[51] Int. Cl.³ .............................................. H01F 15/04
[52] U.S. Cl. .................................. 336/84 C; 336/200; 336/232
[58] Field of Search ..................... 174/35 R, 35 CE; 336/84 C, 84 R, 232, 200

[56] References Cited

U.S. PATENT DOCUMENTS

| | | | |
|---|---|---|---|
| 1,651,922 | 12/1927 | Hughes | 336/84 C X |
| 1,942,575 | 1/1934 | Shapiro | 336/84 C |
| 2,234,998 | 3/1941 | Worrall | 336/84 C X |
| 2,786,984 | 3/1957 | Slate | 336/84 C X |
| 3,546,358 | 12/1970 | Pohl | 336/84 C X |

FOREIGN PATENT DOCUMENTS

| | | | |
|---|---|---|---|
| 129022 | 7/1932 | Fed. Rep. of Germany | 336/84 C |
| 844426 | 4/1939 | France | 336/84 C |
| 52-8423 | 1/1977 | Japan | 336/84 C |

Primary Examiner—Thomas J. Kozma
Attorney, Agent, or Firm—Cushman, Darby & Cushman

[57] ABSTRACT

An electrostatic shield for an electrical conductor element comprises a sheet-like array of closely spaced elongate electrical conductors interconnected at one end of the array by an end conductor for connection to a common or ground potential. The conductor to be shielded may be in the form of a loop or coil printed on one face of an insulating plate and the array of shielding conductors and the end conductor may be printed on the other face of the insulating plate. The shield may include two or more series of parallel conductors arranged in adjacent banks and each provided with a separate end connecting conductor.

4 Claims, 6 Drawing Figures

ELECTROSTATIC SHIELD

This is a continuation, of application Ser. No. 154,295 filed May 29, 1980 now abandoned.

BACKGROUND OF THE INVENTION

This invention relates to the electrostatic shielding of electrical conductor elements. It has particular, but not exclusive, application to the shielding of sensing coils in proximity detectors, which can be used, for example, in the automatic sorting of ores.

In automatic ore sorting systems, it is necessary to characterize all rocks in a moving stream according to the presence or absence of a selected property. The property which is selected as the basis of the sort depends on the nature of the ore being handled but there are certain ores which can be sorted on the basis of resistivity and/or permeability. For example, sulphide and active copper ores exhibit low resistivity which can be used as the basis of a sort and ferromagnetic iron ores can be sorted on the basis of magnetic permeability. The detection of these characteristics in an automatic sorting system requires a non-contact detector which is extremely sensitive and which can respond very rapidly to the presence of the selected property in a fast moving rock.

One type of highly sensitive non-contact detector suitable for the above application comprises a sensor loop or coil connected into a resonant circuit. In use of the detector the resonant circuit is excited substantially to resonance and the presence of an object exhibiting electrical conductivity or magnetic permeability is detected by a change in the amplitude, frequency or phase of a signal in the resonant circuit or a combination of such changes. One particular detector of this type is fully described in our South African Patent Specification No. 78/3420, South West African Patent Specification No. 78/0067 and Australian Patent Specification No. 40858/78.

The sensitivity of non-contact detectors of the above type can be increased by increasing the operational frequency of the resonant circuit. However this requires a decrease in the total circuit capacitance and it is found that the small changes in total capacitance caused by the presence of any object, even a non-conductive or a non-magnetic object, can become significant enough to cause spurious signals. This problem can be alleviated by introducing an electrostatic shield between the coil and the stream of objects to be detected.

For very low frequency operation a thin metal plate can operate satisfactorily as an electrostatic shield. As the operational frequency is increased, however, the generation of eddy currents in the electrostatic shield interferes with the magnetic field of the coil to the extent that the detector is unworkable. For detectors operating at an excitation frequency of the order of 100 KHz this problem can be largely overcome by the use of wire mesh shields but for high frequency operation at say several MHz, the eddy currents generated in mesh shields reduce the transmitted magnetic field to an unacceptable level.

SUMMARY OF THE INVENTION

The present invention provides a novel type of electrostatic shield in which the eddy current effect is very much reduced and which permits reliable detector operation at much higher frequencies than has been possible hitherto.

According to the invention an electrostatic shield for an electrical conductor element comprises a sheet-like array of closely spaced elongate electrical conductors and means electrically to connect one end only of each conductor to a common potential.

The sheet-like array of elongate conductors may be flat or curved, according to the nature of the conductor element to be shielded.

In the case of a flat array, there may be at least one planar series of said elongate conductors interconnected at one end of the series by a further conductor transverse to and in the same general plane as the conductor of said series, the latter conductors being disposed at equal spacing throughout the series and terminating at free ends at the end of the series remote from said further conductor.

In one arrangement, there may be a single series of parallel elongate conductors.

In an alternative arrangement, there may be two or more series of parallel conductors arranged in adjacent banks in the same general plane and each provided with a separate end connecting conductor.

The array of elongate conductors may be formed on an insulating plate by a printed circuit technique. In this case the end connecting conductor or conductors and also the electrical conductor element to be shielded can be printed on the same insulating plate.

Accordingly, the invention also extends to a shielded conductor unit, comprising an electrically insulating plate, an electrical conductor element formed on one face of the plate and, formed on the other face of the plate, a sheet-like array of closely spaced elongate electric conductors and a further conductor electrically connected to one end only of each of said elongate conductors.

BRIEF DESCRIPTION OF THE DRAWINGS

In order that the invention may be more fully explained, some particular embodiments will be described with reference to the accompanying drawings, in which.

DESCRIPTION OF PREFERRED EMBODIMENTS

Figures 1, 2, 3, 4, 5, 6:
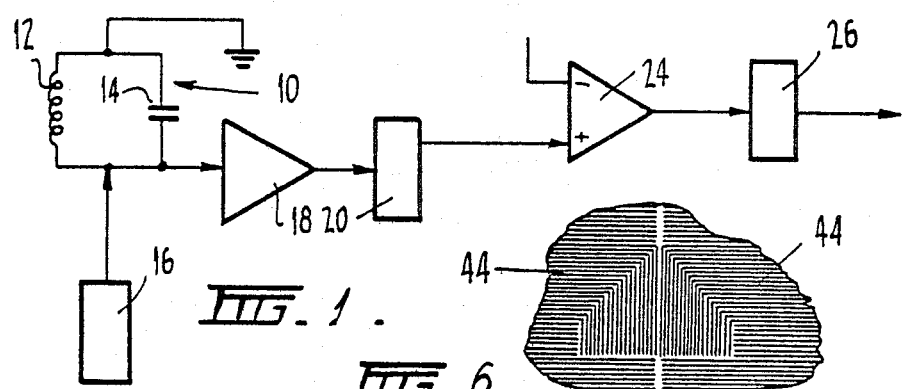
FIG. 1 is a block diagram of the electrical circuit of a proximity detector.
FIGS. 2 and 3 illustrate one type of shielded coil unit which may be incorporated in the detector.
FIG. 4 illustrates an alternative type of shielded coil unit.
FIGS. 5 and 6 illustrate a further type of shielded coil unit.

The proximity detector of FIG. 1 includes a resonant circuit 10 consisting of an inductance 12 and a capacitor 14 connected in parallel, an oscillator maintaining circuit 16, a buffer 18, an amplitude detector 20, an amplifier 24 and a linear voltage controlled oscillator 26.

The oscillator maintaining circuit 16 generates current pulses with a constant amplitude at a frequency very close to the resonant frequency of the circuit 10. The frequency of the oscillator circuit 16 is maintained at the resonant frequency of the circuit 10 by means of a feedback signal. The voltage across the resonant circuit 10 is monitored by the amplitude detector 20 which is responsive to the peak voltage. The buffer 18 which is a FET input wideband unity gain amplifier is interposed between the circuit 10 and the detector 20 to prevent the detector from loading the tuned circuit.

If an object with a low bulk resistivity or high magnetic permeability is moved through the electromagnetic field of the inductance 12 the impedance of the resonant circuit 10 drops because of increased electrical losses associated with the inductance 12. Since the circuit 10 is driven by constant amplitude current pulses from the oscillator maintaining circuit 16, the peak high frequency voltage across circuit 10 will vary in response to its impedance or changes in Q. This change in peak voltage is detected by the detector 20 and applied to the amplifier 24. A reference voltage is also applied to the amplifier so that it functions as a differential amplifier.

The output of the oscillator 26 is a pulse train the frequency of which is proportional to the voltage applied to the oscillator 26. By correctly choosing the reference voltage the output frequency of the oscillator 26 is made proportional to the change in voltage across the resonant circuit. Alternatively one can state that the frequency of the output signal of the oscillator 26 is dependent on the reduction in the Q of the tuned circuit which takes place when an object is moved into the electromagnetic field of the inductance 12.

A full circuit diagram and description of a proximity detector of the type illustrated in FIG. 1 may be found in our South African Patent Specification No. 78/3420, South West African Patent Specification No. 78/0067 and Australian Patent Specification No. 40858/78.

The inductance 12 is in the form of a coil. As used herein, the term "coil" extends to a flat loop or partial loop which are in fact the preferred form of coil.

FIGS. 2 and 3 show opposite sides of one type of shielded coil unit 30 which may be incorporated in the detector to provide the inductance 12. This unit comprises a flat electrically insulating plate 31 on both faces of which electrical conductors are applied by the printed circuit technique. More particularly plate 31, which may be a fibreglass laminate, carries on one face, a coil 32 in the form of a copper conductor disposed in a flat loop and on its opposite face copper conductors forming an electrostatic shield 33 for the coil.

Electrostatic shield 33 comprises a flat sheet-like array of elongate conductors 34 and an earthing strip conductor 35. Conductors 34 are in the form of long, slender fingers which extend in closely spaced parallel formation from earthing strip 35 to outer free ends 36. Earthing strip 35 extends transversely of the conductors 34 and interconnects adjacent ends of those conductors at one end of the series in the longitudinal direction of the conductors.

Conductors 34 may be of the order of 0.010 inches wide and 0.001 inches thick. They should be spaced as close together as possible without establishing any points of electrical contact between them along their lengths. Typically, they may be spaced about 0.007 inches apart. It is not possible accurately to reproduce these dimensions in the drawings and it is to be understood that the drawings are diagrammatic to the extent that they show the arrangement of the elongate conductors but not the total number or their actual size and spacing.

The gap between the coil and the shield must be much greater than the gaps between the conductors 34. For example, the thickness of plate 31 may be about 10 times greater than the gaps between the conductors.

The flat sheet-like array of conductors 34 extends completely across coil 32 and when the coil unit is installed in the detector it serves as a screen interposed between the coil and the objects to be detected. The conductors 34 are earthed through earthing strip 35. With this arrangement the capacative circuit from the coil through the object to be detected is shunted by the earthed conductors 34. Thus the effects of the capacitance of the objects to be detected are minimised. Moreover, large eddy currents cannot develop in the individual conductors 34 because of their narrowness and the magnetic field of the coil is therefore substantially unaffected.

FIG. 4 illustrates alternative form of shielded coil unit in which the electrostatic shield comprises two series of parallel conductors 34A arranged in adjacent banks on the respective face of the insulating plate 31A and provided with separate earthing strips 35A. The earthing strips are formed at the edges of the insulating plate so that earthing connections can be made by contact with a metal box or housing for the unit.

With the arrangement of FIG. 4 the lengths of the conductors which can couple with the coil are very much reduced and the shielding effect is therefore enhanced.

FIGS. 5 and 6 illustrate a further form of shielded coil unit in which substantially all of the elongate conductors of the electrostatic shield cross the coil 32B transversely, thereby minimizing the capacitive coupling between the conductors and the coil. In this case there are two series 41 of parallel straight conductors arranged in adjacent banks to extend across the central part of the coil; two series 42 of L-shaped conductors and a further series 43 of parallel straight conductors to extend across the open end of the coil; and two series 44 of L-shaped conductors to extend across the closed end of the coil.

By incorporating the sensing coil and electrostatic shield in a single printed circuit unit it is possible to eliminate all relative movement between the coil and the shield. This is an extremely important advantage for high frequency operation because at high frequencies even small relative movements between the coil and shield can induce changes in the oscillating circuit sufficient to cause spurious signals.

The invention is in no way limited to the details of the illustrated detector and coil units, which have been advanced by way of example only. The elongate conductors of the electrostatic shield need not be formed as a printed circuit but could be formed of separate wires. Moreover, they need not be formed in a flat array but could be formed into a cylindrically curved sheet-like array or some other formation depending on the nature of the conductor element to be shielded. It is accordingly to be understood that many modifications and variations will fall within the scope of the appended claims.

We claim:

1. An electrostatically shielded conductor unit comprising an electrically insulating plate having a first face and an opposite face, a coil having a longitudinal axis and formed in a path of generally rectangular configuration in the plane of said first face formed on said first face by a printed circuit technique, the longitudinal axis extending along the coil and following the rectangular configuration, an electrostatic shield in the form of a sheet-like array of closely spaced elongate conductors disposed so that where elongate conductors cross the coil, they all do so at right angles to the longitudinal axis thereof, said conductors being formed on said opposite face of said plate by a printed circuit technique, and means for connecting the elongate conductors to a common potential.

2. A shielded conductor unit as in claim 1 wherein the thickness of the insulating plate is such that one face and the other face are separated by a distance greater than the separation between the closely spaced conductors.

3. A shielded conductor unit as in claim 2 in which said distance is at least several times greater than said separation.

4. A shielded conductor unit as in claim 3 in which said distance is ten times greater than said separation.

* * * * *